United States Patent
Tsui et al.

(10) Patent No.: US 6,806,103 B1
(45) Date of Patent: Oct. 19, 2004

(54) METHOD FOR FABRICATING SEMICONDUCTOR DEVICES THAT USES EFFICIENT PLASMAS

(75) Inventors: Ting Tsui, Plano, TX (US); Andrew John McKerrow, Dallas, TX (US); Yuji Richard Kuan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/458,154

(22) Filed: Jun. 10, 2003

(51) Int. Cl.[7] .............................................. G01R 31/26
(52) U.S. Cl. ........................ 438/14; 438/687; 438/791
(58) Field of Search ........................ 438/14, 687, 791, 438/795

(56) References Cited

U.S. PATENT DOCUMENTS

| | | | |
|---|---|---|---|
| 6,424,038 B1 * | 7/2002 | Bao et al. ................... | 257/741 |
| 2003/0022509 A1 * | 1/2003 | Rathi et al. ................. | 438/706 |
| 2003/0139043 A1 * | 7/2003 | Marcus et al. ............... | 438/689 |
| 2003/0170945 A1 * | 9/2003 | Igeta et al. ................. | 438/200 |

OTHER PUBLICATIONS

Junji Noguchi, Naofumi Ohashi, Jun–ichi Yasuda, Tomoko Jimbo, Hizuru Yamaguchi, Nobuo Owada, Ken–ichi Takeda and Kenji Hinode; "TDDB Improvement in CU Metallization Under Bias Stress", IEEE 38th Annual Int'l Reliability Physics Symposium, San Jose, California 2000; pp. 339–343.

* cited by examiner

*Primary Examiner*—Hsien Ming Lee
(74) *Attorney, Agent, or Firm*—Peter K. McLarty; W. James Brady III; Frederick J. Telecky

(57) ABSTRACT

The present invention provides, in one embodiment, process of treating a target semiconductor surface. The process includes exposing a test surface to a plasma protocol (110), and measuring chemical changes in discrete locations of the test surface (120). The process further includes preparing a target surface by exposing the target surface to the plasma protocol (140) when a uniformity of the chemical changes are within a performance criterion of the plasma protocol (130). Other embodiments advantageously incorporate this process into methods for making semiconductor devices and integrated circuits.

17 Claims, 6 Drawing Sheets

METHOD FOR FABRICATING SEMICONDUCTOR DEVICES THAT USES EFFICIENT PLASMAS

TECHNICAL FIELD OF THE INVENTION

The present invention is directed in general to the manufacture of integrated circuits, and, more specifically, to a method of fabricating semiconductor devices using processing steps that use an efficient plasma.

BACKGROUND OF THE INVENTION

The continuing miniaturization of semiconductor devices and the desire to produce faster semiconductor devices, has resulted in a shift toward the use of copper for making electrical interconnections in ultra-large scale integration circuits. Consider the fabrication of copper damascene interconnects, for example. Copper interconnect structures are formed by first depositing a dielectric layer on a semiconductor substrate, and then patterning and etching the dielectric layer to form an opening, such as a damascene structure. A refractory metal barrier, such a tantalum nitride or titanium nitride, and a copper seed layer are deposited in the opening. The opening is filled with copper, by electroplating onto the seed layer. The electrodeposited copper is then planarized by chemical mechanical polishing, leaving an inlaid copper structure.

The use of copper interconnects are not without difficulties, however. Copper atoms tend to readily diffuse into silicon-containing dielectric layers. The contamination by copper in unwanted locations can degrade or destroy the performance of active devices in integrated circuits. A dielectric barrier layer, such as silicon nitride or silicon carbide, deposited on the inlaid copper structure helps suppress copper migration and oxidation of the inlaid copper structure. The ability of the dielectric barrier to perform these functions and to adhere to copper is facilitated by depositing the dielectric on a uniformly prepared inlaid copper surface. Typically the inlaid copper structure is treated with a reducing plasma to remove copper oxides and contaminants, such as organic compounds, from the surface before depositing the dielectric barrier layer.

Failure of the dielectric barrier can result in significant additional costs to manufacture semiconductor devices, as well as diminish the perceived reliability of the semiconductor device by customers. At present, failure in the functioning of the dielectric barrier is only realized late in semiconductor device fabrication, or after the semiconductor device has been substantially completed. Often the detection of failure is by the observation of delamination of the dielectric barrier and any overlying structures from the inlaid copper structure, or by the failure of the semiconductor device to operate in the field. One reason why failures are detected late or after the fabrication process is because there is no practical method available to determine whether the plasma treatment of the copper inlaid surface was efficient for the entire copper surface.

Accordingly, what is needed in the art is a method of manufacturing semiconductor devices that includes the use of efficient plasma treatments.

SUMMARY OF THE INVENTION

To address the above-discussed deficiencies of the prior art, the present invention provides a process of treating a target semiconductor surface. The process includes exposing a test surface to a plasma protocol and measuring chemical changes in discrete locations of the test surface. A target surface is prepared by exposing the target surface to the plasma protocol when a uniformity of the chemical changes are within a performance criterion of the plasma protocol.

In another embodiment, the present invention provides a semiconductor device made using the above-described process. A target surface is treated with a plasma protocol as described above and a dielectric layer is deposited on the target surface.

Yet another embodiment of the present invention is a method of manufacturing an integrated circuit. The method comprises forming an active device over a semiconductor substrate and forming an interconnect metal structure over the active device. Forming the interconnect metal structure includes treating said interconnect metal structure by the above-described process. Manufacturing the integrated circuit further includes connecting the interconnect metal structure to the active device to form an operative integrated circuit.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes, for the first time, the advantages of using a test surface to qualify a plasma protocol to be used to treat a target surface in the fabrication of a semiconductor device. The advantage of this approach is that it allows the subject plasma protocol to be continuously or periodically monitored inside a semiconductor fabrication facility. This, in turn, allows unsatisfactory plasma protocols to be detected earlier in the fabrication process than hitherto possible. The result is that the costly production of defective semiconductor devices is avoided. Although discussed in the context of a process for forming copper interconnections in, for example, vias, trenches or lines, the present invention could be equally applied to any semiconductor fabrication process where a plasma is used to prepare a target surface for subsequent fabrication steps. For instance, the semiconductor industry uses plasmas to facilitate numerous steps in semiconductor processing including deposition, oxidation, implantation, etching, and ashing.

Figure 1A:
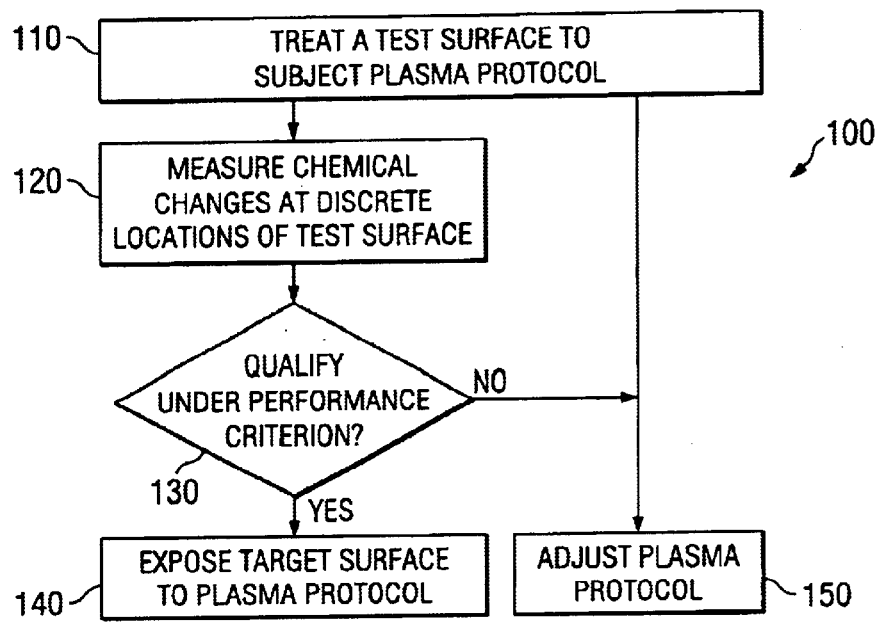
FIGS. 1A and 1B illustrate, respectively, a flow diagram showing selected steps in a process of treating a target semiconductor surface according to the principles of the present invention, and a sectional view of a semiconductor wafer having a test surface located thereon.
Figure 1B:
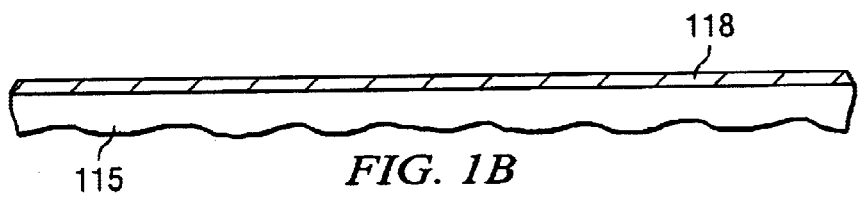

One embodiment of the present invention is illustrated in FIGS. 1A and 1B. FIG. 1A is a flow diagram showing selected steps in a process 100 of treating a target semiconductor surface, and FIG. 1B illustrates a sectional view of a semiconductor wafer 115 having a test surface 118 located thereon. In step 110, the test surface 118 is exposed to a plasma protocol. The test surface 118 is any surface that can be chemically modified by the plasma protocol of interest. Preferably, the same instrument and protocol is applied to the test surface 118 as to be used in the preparation of target semiconductor surfaces for the fabrication of the semiconductor device.

In certain preferred embodiments, the test surface 118 is a layer of silicon dioxide on the semiconductor wafer 115. The test surface 118 can be formed using conventional techniques, such as thermally growing silicon dioxide to a desired thickness under conditions well known to those of ordinary skill in the art. In alternative embodiments, however, the test surface 118 may be a layer of silicon carbide on the semiconductor wafer 115.

The desired thickness of the test surface 118 depends on the technique used to assess the uniformity of chemical changes imparted by the plasma protocol of interest. For instance, in embodiments when ellipsometry is used to measure the uniformity of the test surface 118, then it is advantageous for the test surface 118 to be a thin layer, for example, a layer of silicon dioxide between about 20 and 40 Angstroms, and more preferably, about 30 Angstroms thick. In other embodiments, however, when X-ray photoelectron spectroscopy (XPS) is used to measure the uniformity of the test surface 118, then the test surface 118 may be much thicker, for example, about one micron or thicker.

In step 120, chemical changes in discrete locations of the test surface 118 are measured. As well understood by those skilled in the art, numerous techniques are capable of measuring chemical changes imparted to the test surface 118 by a plasma treatment. For example, it is well known that nitridation of silicon dioxide by a $NH_3$ or $N_2$ plasma treatment increases the thickness of the resulting SiONx layer (where x is between about 0.03 and about 1). Therefore, ellipsometry can be used to assess the uniformity of nitridation of a silicon dioxide test surface by measuring local changes in the thickness of the test service associated with the formation of SiONx. Ellipsometry also is advantageous because it can be used in a semiconductor fabrication facility to provide a rapid measurement of thickness for multiple discrete locations on a semiconductor wafer surface.

Alternatively, XPS can be used to measure the uniformity of nitridation of the silicon dioxide or silicon carbide test surface, assessed by quantifying the N content of discrete regions of the test surface. In still other embodiments where the plasma treatment includes a $H_2$ plasma, the uniformity of the plasma treatment can be measured by using ellipsometry to measure local changes in the thickness of the test surface. Similar procedures could be used for other plasma treatments, such as a He plasma treatment.

In step 130, the measured chemical changes are used to determine whether or not the plasma protocol qualifies under a performance criterion. A suitable performance criterion assesses the uniformity of the chemical change to the test surface. For example, as illustrated in the experimental section below, ellipsometry-detected changes in the thickness of a silicon dioxide test surface produced by a $NH_3$ plasma can be averaged for 49 discrete measurement locations. When a standard deviation of the average change in thickness is less than 20 percent, the performance criterion is met, whereas a percent standard deviation of greater than 20 percent is unacceptable. One skilled in the art would understand, however, that numerous other performance criteria may be used to qualify a plasma protocol and that such criteria would change depending on the plasma protocol being tested and well as the test surface 118. As an example, if XPS is used to measure the chemical changes imparted by a $NH_3$ plasma, then the performance. criterion can be a maximum difference in an average N content measured across the test surface of less than about one atomic percent.

Figure 2A:
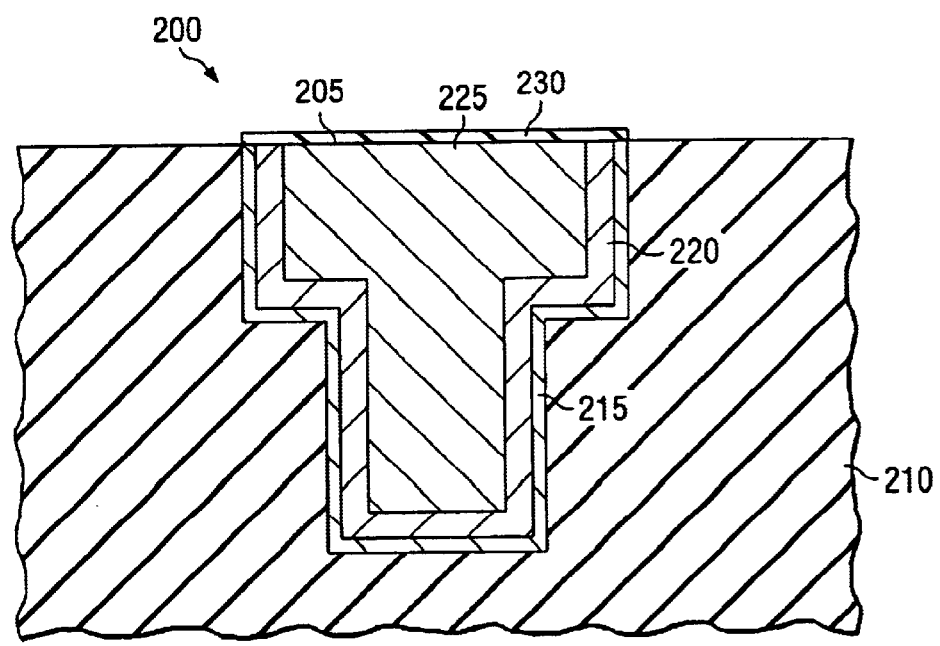
FIGS. 2A to 2C illustrate sectional views of selected steps in a process for producing a semiconductor device according to the principles of the present invention.

As indicated in step 140, when the plasma treatment is with the performance criterion, then a target surface, such as the one illustrated in FIG. 2A, is prepared by exposing the target surface to the plasma protocol. Alternatively, as illustrated in step 150, if the performance criterion is not met, the plasma protocol can be suitably altered, and the test process on a test surface repeated.

In certain preferred embodiments, the target surface is a metal interconnect structure. The metal interconnect structure may include a metal oxide, such as copper oxide, or contaminants, such as organic compounds, that the plasma protocol is capable of removing. As noted previously, reducing $NH_3$ plasma protocols are routinely used to prepare metal surfaces, such as copper, for the deposition of a dielectric layer thereon. In other embodiments, the target surface includes nickel silicide ($Ni_2Si$) and the plasma protocol includes a $NH_3$ plasma.

Figure 2B:
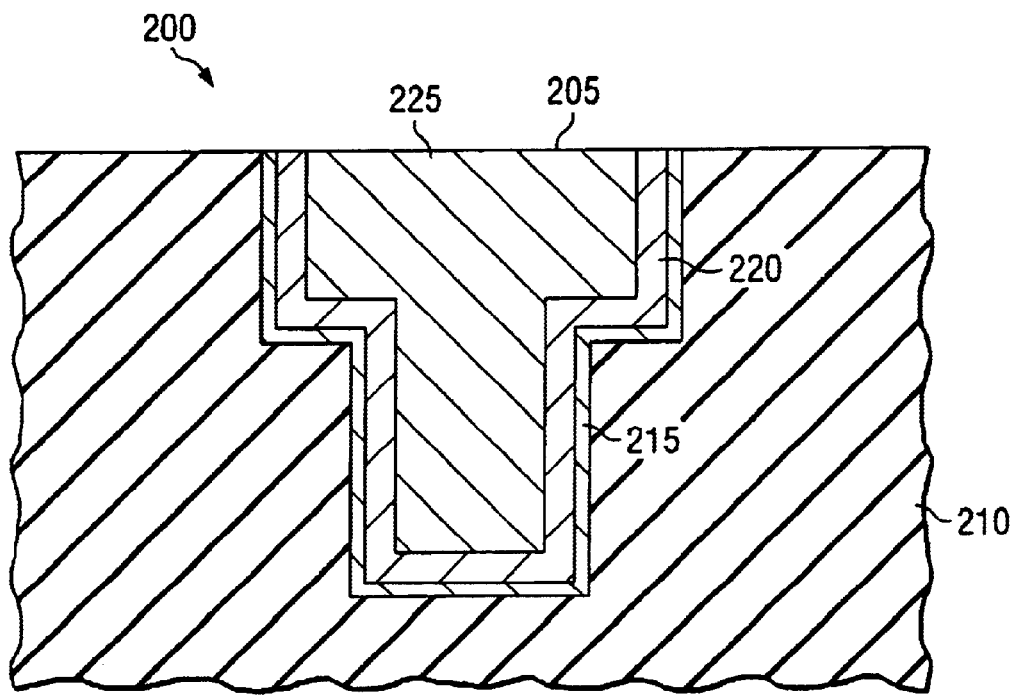
Figure 2C:
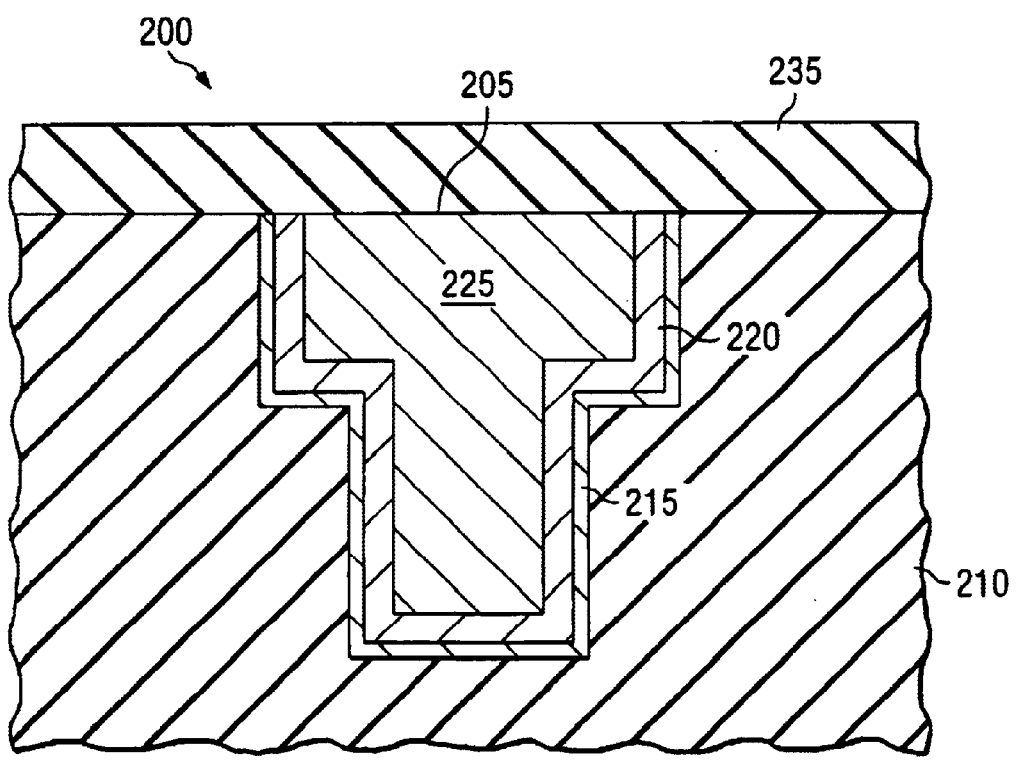

Another embodiment of the present invention is illustrated in FIGS. 2A to 2C, a semiconductor device 200 made by a process that includes substantially the same plasma treatment process described above and illustrated in FIG. 1. Turning first to FIG. 2A, illustrated is a step of providing a target surface 205. In certain embodiments, the target surface is a conventionally prepared metal interconnect surface 205. The steps to prepare a metal interconnect surface 205 are well known to those skilled in the art, including etching and then filling a dielectric layer 210 with a metal barrier 215, metal seed layer 220 and then metallized to form an inlaid metal structure 225, followed by chemical mechanical polishing. As indicated above, such target surfaces 205 retain oxides and contaminants 230.

As shown in FIG. 2B, the target surface 205 is then treated with a plasma protocol that has been qualified using the process illustrated in FIG. 1 to yield a surface 205 substantially uniformly free of oxides and contaminants. Next, as illustrated in FIG. 2C, a dielectric layer 235 is deposited on the target surface 205. In certain embodiments, the dielectric layer 235 comprises silicon nitride, while in other embodiments, the dielectric layer 235 comprises silicon carbide. A preferred method for depositing the dielectric layer 235 is plasma enhanced chemical vapor deposition.

Treating the target surface 205 with a qualifying plasma protocol can produce several improvements in the semiconductor device 200. Certain embodiments of the semiconductor device 200 are more resistant to delamination. In some embodiments, for instance, an interface between the test surface 205 and the dielectric layer 235 has an adhesion of at least about 12 J/m² as measured using a conventional 4-point bend technique. In other embodiments of the semiconductor device 200, electromigration of the inlaid metal 225 is reduced, as compared to the electromigration encountered for devices not made using a plasma protocol that has been qualified as described above.

Figure 3A:
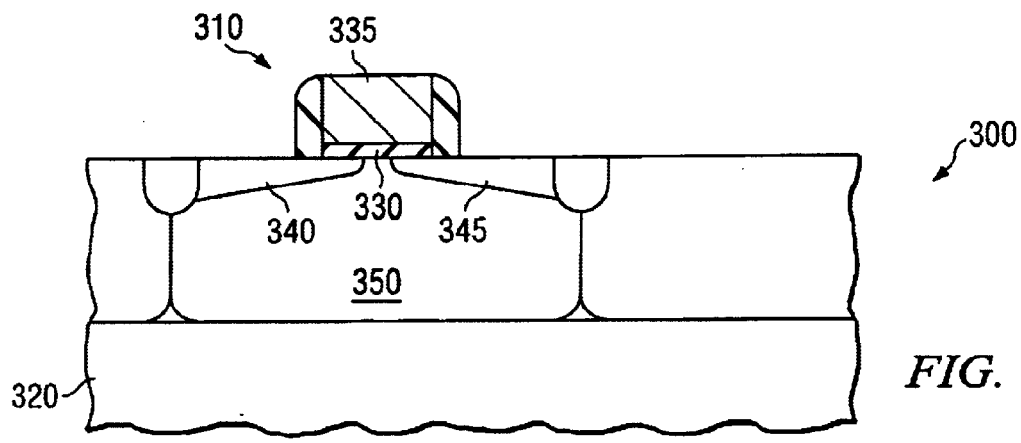
FIGS. 3A to 3C illustrate sectional views of selected steps in a method of making an exemplary integrated circuit according to the principles of the present invention.
Figure 3B:
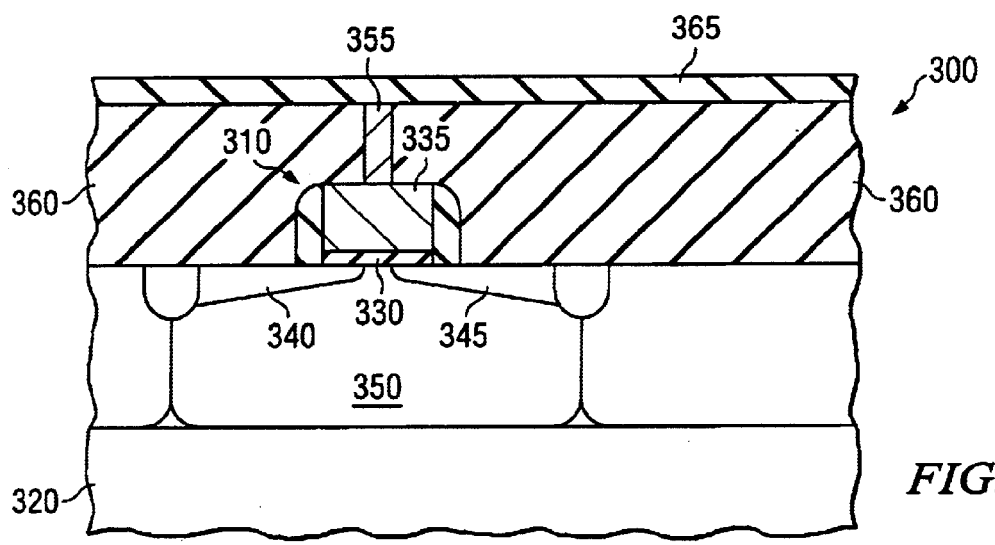
Figure 3C:
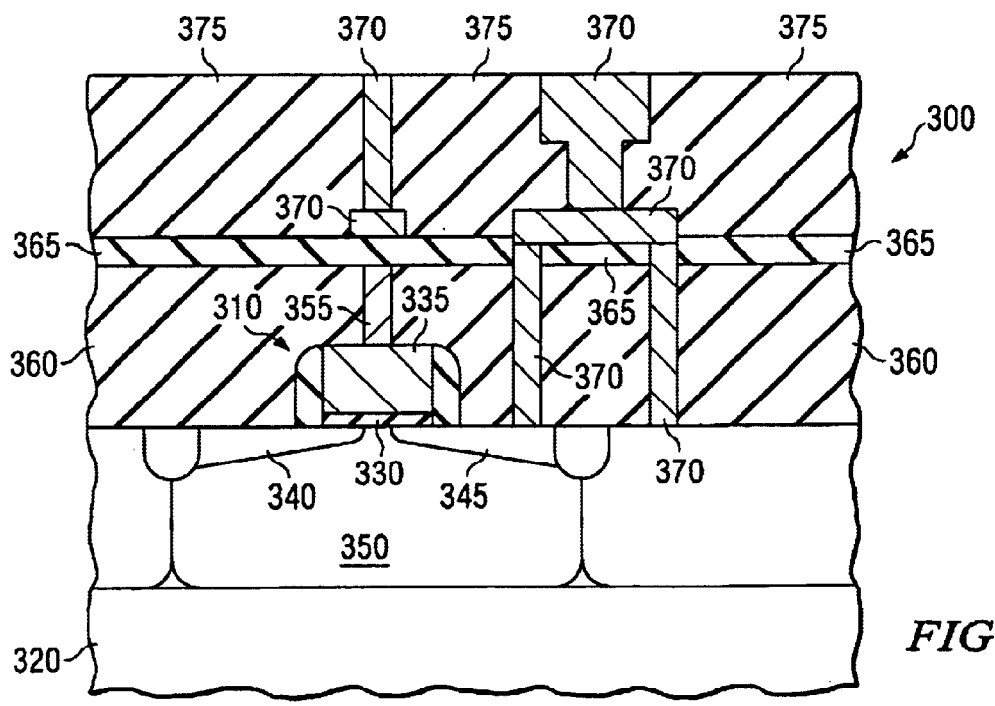

FIGS. 3A–C illustrate another aspect of the present invention, a method of making an integrated circuit 300 at selected stages of fabrication. The integrated circuit 300 may include CMOS, BiCMOS devices, bipolar or other types of conventional integrated circuit components. FIG. 3A illustrates forming an active device 310 over a semiconductor substrate 320. Shown in FIG. 3A are components of the active device 310, including a gate oxide layer 330, gate 335, source and drain regions 340, 345 p or n tub 350.

FIG. 3B shows forming an interconnect metal structure 355, such as a copper interconnect, in or on one or more dielectric layers 360, located over the active devices 310. Any of the above described embodiments of the process for treating the interconnect metal structure may be applied to forming the interconnect metal structure 355, including depositing a dielectric layer 365, such as silicon nitride, on the interconnect metal structure 355 after exposing the surface of the interconnect metal structure 355 to a qualified plasma protocol, as described above. FIG. 3C illustrates connecting the interconnect metal structure 355 to the active device 310 to form an operative integrated circuit 300, by forming interlevel via connections 370 through one or more dielectric layers 360, 365, 375.

In certain preferred embodiments of the method, the yield of reliable integrated circuits 300 manufactured per semiconductor substrate wafer 320, is improved as compared to the yield obtained when the qualified plasma protocol is not used. In some embodiments, For instances, the number of operative integrated circuit produced per water 320 that have a predefined reliability is greater than a yield of operative integrated circuits manufactured using an plasma protocol without the performance criterion.

The predefined reliability of the integrated circuit 300 can be assessed using any number of conventional procedures, well know to those skilled in the art. In some instances, for example, the breakdown of the dielectric layer 360 is assessed by measuring the leakage current density between interconnect metal structures 355. If the leakage current is below a predefined limit, (e.g., 1 mA/cm²) the integrated circuit 300 is considered to be reliable. In some preferred embodiments, the leakage current is measured at a predefined electrical field strength between about 2 and about 8 MV/cm, after a predefined interval between about 10 and $10_6$ seconds, and a predefined temperature of about 140° C.

Having described the present invention, it is believed that the same will become even more apparent by reference to the following experiments. It will be appreciated that the experiments are presented solely for the purpose of illustration and should not be construed as limiting the invention. For example, although the experiments described below may be carried out in a laboratory setting, one skilled in the art could adjust specific numbers, dimensions and quantities up to appropriate values for a full-scale production plant setting.

EXPERIMENTAL RESULTS

Experiments were conducted to examine and compare the ability of ellipsometry and XPS to characterize different types ammonium plasma treatments of a silicon dioxide test surface. This was done to determine whether the plasma treatments met performance criterion for plasma treating a copper metal surface. Additional experiments were conducted to establish that a plasma treatment that has been qualified by passing some specific performance criterion results in an acceptable dielectric layer on a target copper surface. Analogous comparative experiments were conducted using a plasma treatment that did not pass the performance criterion.

In one series of experiments, test surfaces, as represented by FIG. 1B, of silicon dioxide were thermally grown on a silicon wafers to a thickness of between about 20 and 300 Angstroms. The wafers were then exposed to one of two different $NH_3$ plasma treatments. The first protocol comprised an $NH_3/N_2$ dual frequency plasma, conducted using a first instrument. A second protocol, comprising an $NH_3$ plasma, conducted using an F-5 instrument.

The uniformity of nitridation of the silicon dioxide test surfaces was then measure using ellipsometry and XPS. Ellipsometry measurements (F-5 instrument, KLA-Tencor Corp., San Jose, Calif.) were made from 49 discrete locations on the wafer surface before and after either the first or second plasma protocols. Ellipsometry measurements of the silicon dioxide were conducted using wavelengths from 250 to 750 nm, and using data extracted at 633 nm to determined the thickness of the silicon dioxide layer at each of the discrete locations.

XPS measurements (PHI 5600 ESCA system, Perkin-Elmer, Wellesley, Mass.) were made from 4 discrete locations on the wafer surface before and after one of the two plasma protocols. The XPS measurements to determine the atomic N content of the silicon dioxide comprised using a mono Al X-ray source (Ka 1486.7 ev) operating at 300 Watts (Maxi. 400 Watts), a photoelectron collecting angle of 45 degree ±15%, with data acquired in a high resolution mode with a Pass energy of 23.5 ev. Data were routinely collected from the native test surface before and after the plasma treatment, either with no further preparation of the surface, and after the sputtering the test surface with a low energy ion beam to remove potential surface organic contaminants that may form on the surface of the wafer during subsequent handling the samples for XPS measurements. In general, there was no substantial difference between XPS measurements with and without sputtering, indicating that contamination from to handling the samples for XPS measurements was negligible.

Figure 4:
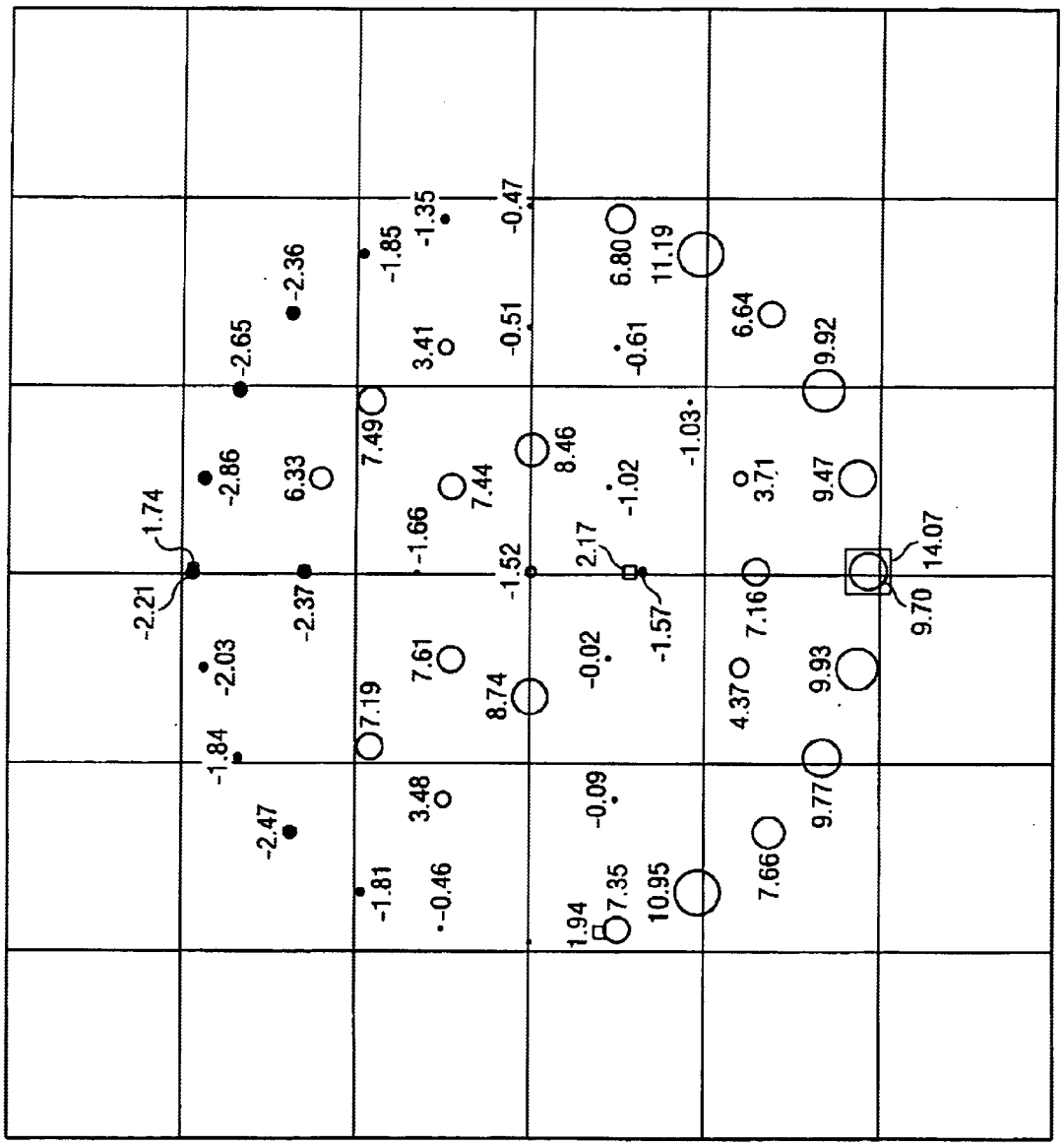
FIG. 4 presents exemplary ellipsometry and X-ray photoelectron spectroscopy data for a test surface treated with a first plasma protocol.
Figure 5:
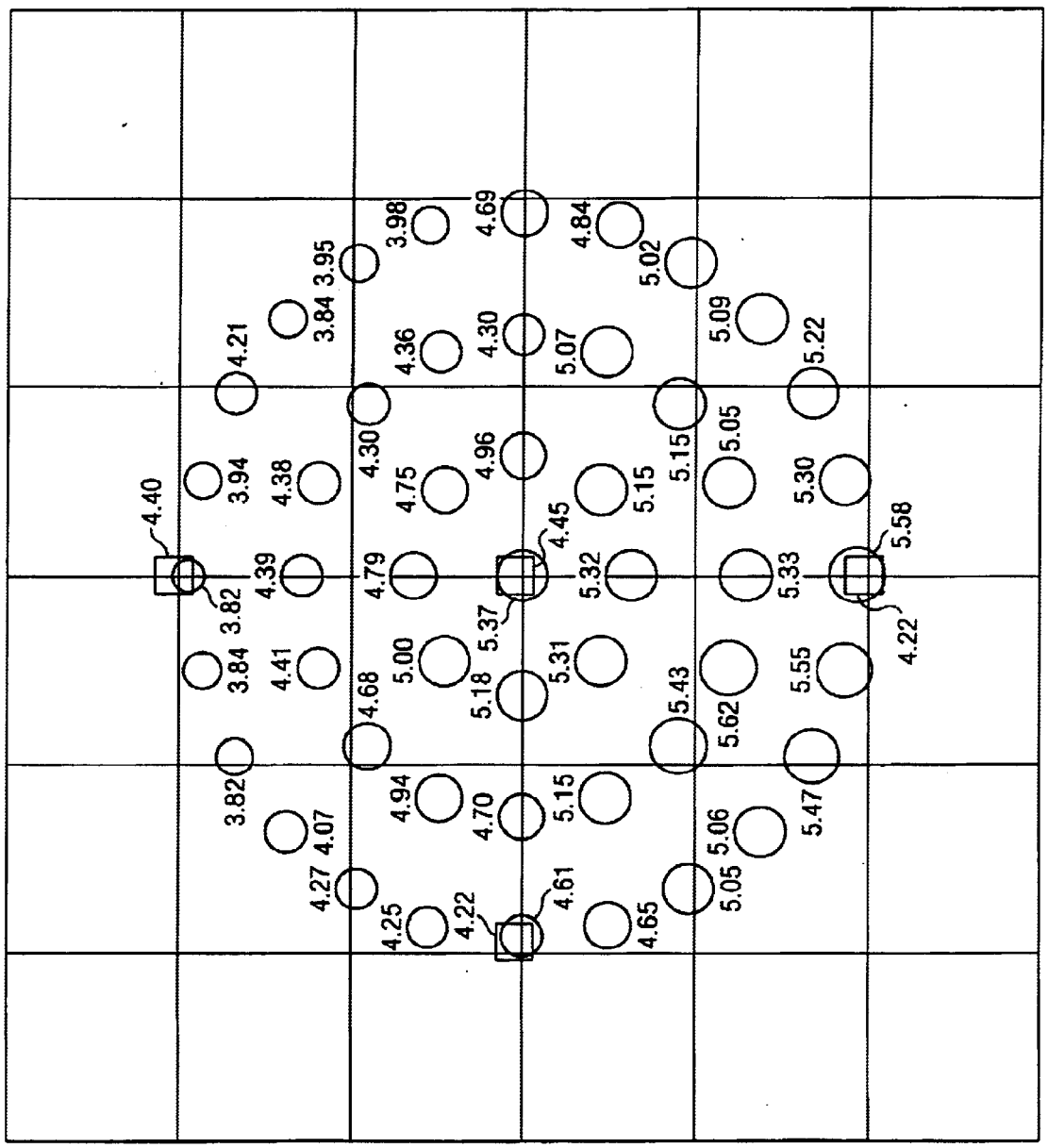
FIG. 5 presents exemplary ellipsometry and X-ray photoelectron spectroscopy data for a test surface treated with a second plasma protocol.

Exemplary results obtained from the first and second plasma protocols are illustrated in FIGS. 4 and 5, respectively. Thickness data from ellipsometry measurements of 49 locations of a wafer are designated by circles, the diameter being roughly proportional to the difference in thickness between post plasma treatment thickness minus pretreatment thickness. The average ± standard deviation of the change in thickness of 49 discrete locations measured by ellipsometry was calculated and used as a performance criterion. XPS data from 4 discrete locations of the wafer, depicted as squares, is shown as the percent change in the atomic N content (i.e., post plasma treatment N content x 100%/pretreatment N content). The maximum difference between the percent change in N content was used as another performance criterion.

Figure 6:
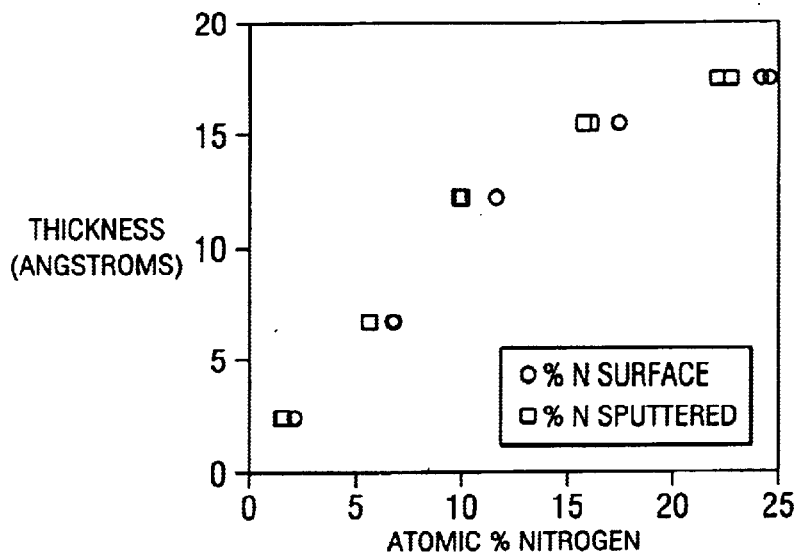
FIG. 6 presents exemplary data comparing ellipsometry and x-ray photoelectron spectroscopy data collected for test surface treated using the second plasma protocol illustrated in FIG. 5.

The assessments of uniformity of nitridation provided by ellipsometry and XPS measurements were in good agreement with each other. For example exemplary data in FIG. 6, showing a strong correlation between the increase in thickness, measured by ellipsometry, and the increase in N content of the test silicon dioxide layer as a function of different periods of $NH_3$, plasma treatment using the second plasma protocol. The second plasma protocol (FIG. 5) resulted in a substantially more uniform nitridation of test silicon dioxide surfaces than the first plasma protocol (FIG. 4).

For the data shown in FIGS. 4 and 5, for instance, the average change in thickness of the silicon dioxide layer was about 4.8±0.5 Angstroms using the second plasma protocol (i.e., a standard deviation of less than about 20 percent), as compared to about 2.9±4.8 Angstroms using the first plasma protocol. Similarly, the maximum difference in the increase in N content for the 4 discrete locations measured by XPS was less than about 1 atomic percent using the second plasma protocol, as compared to a maximum difference of greater than about 12 percent using first plasma. These, or analogous measurements of the uniformity of chemical changes in a test surface can be used as performance criteria for various plasma protocols.

In another series of experiments, an $H_2$ plasma treatment protocol was investigated. Test surfaces, having an about 30 Angstrom layer of silicon dioxide on a silicon wafer, were exposed to $H_2$ gas in the presence or absence of plasma, using procedures and instrumentation similar to that described above. Changes in the thickness of the silicon dioxide test surfaces were then measured from 21 discrete locations using ellipsometry, also similar to that described above.

Figure 7:
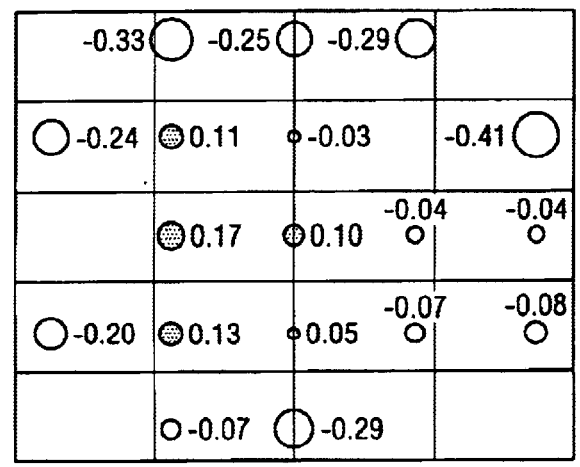
FIG. 7 presents exemplary ellipsometry data for a test surface exposed to $H_2$ gas.
Figure 8:
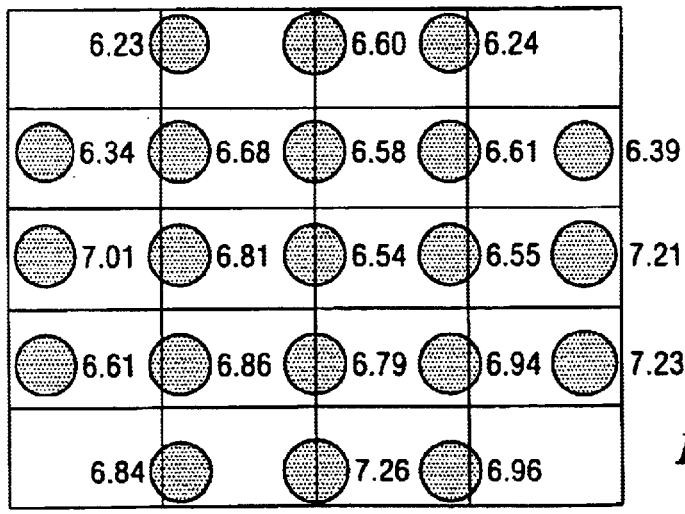
FIG. 8 presents exemplary ellipsometry data for a test surface to be exposed to $H_2$ gas and third plasma protocol.

Exemplary results obtained for wafer surfaces after exposure to $H_2$ gas alone and after exposure to $H_2$ gas in the presence of a plasma, are presented in FIGS. 7 and 8, respectively. It is apparent the $H_2$-plasma treatment resulted in a uniform increase in thickness of the silicon dioxide layer about 7 Angstroms (FIG. 8). In contrast, the silicon dioxide layer on wafers exposed to $H_2$ but no plasma, did not substantially change in thickness (FIG. 7). While not limiting the scope of the invention by theory, it is thought that the $H_2$-plasma treatment causes hydroxylation of the test surface, resulting in the formation of $SiOH_x$ species (where x is between about 0.03 and about 1) and associated change in thickness.

Although the present invention has been described in detail, one of ordinary skill in the art should understand that they can make various changes, substitutions and alterations herein without departing from the scope of the invention.

What is claimed is:

1. A process of treating a target semiconductor surface, comprising:
   providing a predetermined target range of measured changes on a test surface;
   exposing said test surface to a plasma protocol;
   measuring chemical changes in locations of said test surface; and
   preparing a target surface comprising a metal oxide by exposing said target surface to said plasma protocol when said range of measured changes are within said predetermined target range.

2. The process as recited in claim 1, wherein said test surface is a layer of silicon dioxide on a semiconductor wafer.

3. The process as recited in claim 1, wherein said test surface is a layer of silicon carbide on a semiconductor wafer.

4. The process as recited in claim 1, wherein said range of measured changes is determined by ellipsometry.

5. The process as recited in claim 1, wherein said range of measured changes is determined by X-ray photoelectron spectroscopy.

6. The process as recited in claim 1, wherein said predetermined target range corresponds to a change in an average thickness of said test surface with a standard deviation of less than 20 percent.

7. The process as recited in claim 1, wherein said predetermined target range corresponds to a maximum difference in an N content across said test surface is less than one percent.

8. The process as recited in claim 1, wherein said metal oxide surface includes copper.

9. A process of treating a target semiconductor surface, comprising:
   providing a predetermined target range of measured changes on a test surface;
   exposing said a test surface to a plasma protocol;
   measuring chemical changes in locations of said test surface; and
   preparing a target surface comprising a metal silicide by exposing said target surface to said plasma protocol when said range of measured changes are within said predetermined target range.

10. A semiconductor device produced by the process including:
    providing a predetermined target range of chemical changes on a test surface;
    treating a target surface comprising a metal oxide with a plasma protocol comprising:
       exposing a test surface to a plasma protocol;
       measuring chemical changes in discrete locations of said test surface; and
       exposing said target surface to said plasma protocol when said chemical changes are within said predetermined target range; and
    depositing a dielectric layer on said target surface.

11. The semiconductor device recited in claim 10, wherein said target surface includes a copper oxide in an interconnect metal structure and said dielectric layer comprises silicon nitride.

12. The semiconductor device recited in claim 11, wherein an interface between said interconnect metal structure and said dielectric layer has an adhesion of at least about 12 J/m².

13. A method of manufacturing an integrated circuit, comprising:
    providing a predetermined target range of chemical changes on a test surface;
    forming an active device over a semiconductor substrate;
    forming an interconnect metal structure over said active device, including;
       treating said interconnect metal structure comprising:
          exposing a test surface to a plasma protocol;
          measuring chemical changes on said test surface; and
          exposing said interconnect metal structure to said plasma protocol to remove oxides or contaminants from said interconnect metal structure when said chemical changes are within said predetermined target range;
    connecting said interconnect metal structure to said active device to form an operative integrated circuit.

14. The method as recited in claim 13, wherein forming said interconnect metal structure further includes depositing a dielectric layer on said interconnect metal structure after said exposing.

15. The method as recited in claim 14, wherein said interconnect metal structure comprise copper and said dielectric layer comprise silicon nitride.

16. The method as recited in claim 14, wherein said test surface is a layer of silicon dioxide on a semiconductor wafer.

17. The method as recited in claim 14, wherein said wherein said chemical changes are determined by ellipsometry.

* * * * *